(12) United States Patent
Choi et al.

(10) Patent No.: US 9,496,878 B2
(45) Date of Patent: Nov. 15, 2016

(54) PHASE-LOCKED LOOP AND INTEGRATED CIRCUIT CHIP INCLUDING THE SAME, AND TEST SYSTEM INCLUDING THE INTEGRATED CIRCUIT CHIP

(71) Applicant: SK hynix Inc., Gyeonggi-do (KR)

(72) Inventors: Hae-Rang Choi, Gyeonggi-do (KR); Joo-Hwan Cho, Gyeonggi-do (KR); Kwang-Jin Na, Gyeonggi-do (KR); Kwan-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/714,357

(22) Filed: Dec. 13, 2012

(65) Prior Publication Data

US 2013/0294186 A1    Nov. 7, 2013

(30) Foreign Application Priority Data

May 2, 2012    (KR) .................. 10-2012-0046468

(51) Int. Cl.

| | |
|---|---|
| *G11C 7/22* | (2006.01) |
| *H03K 23/68* | (2006.01) |
| *H03L 7/08* | (2006.01) |
| *H03K 21/00* | (2006.01) |
| *G11C 29/08* | (2006.01) |
| *H03K 21/02* | (2006.01) |
| *H03L 7/099* | (2006.01) |
| *H03L 7/16* | (2006.01) |
| *H03L 7/18* | (2006.01) |
| *G11C 29/02* | (2006.01) |

(52) U.S. Cl.
CPC .............. *H03L 7/08* (2013.01); *G11C 29/023* (2013.01); *G11C 29/028* (2013.01); *G11C 29/08* (2013.01); *H03K 21/00* (2013.01); *H03K 21/023* (2013.01); *H03L 7/099* (2013.01); *H03L 7/16* (2013.01); *H03L 7/18* (2013.01)

(58) Field of Classification Search
CPC ......... G11C 29/50; G11C 7/22; G11C 7/222; G11C 2207/22
USPC .................. 365/233.1, 189.04, 201, 233.11; 327/269, 155, 148, 157, 147, 116, 589, 327/376; 331/1 A
See application file for complete search history.

(56) References Cited

U.S. PATENT DOCUMENTS

| | | | |
|---|---|---|---|
| 5,920,518 A * | 7/1999 | Harrison et al. ......... | 365/233.11 |
| 6,441,660 B1 * | 8/2002 | Ingino, Jr. ............ | H03K 3/0315 327/156 |
| 6,744,323 B1 * | 6/2004 | Moyal et al. ................ | 331/1 A |

(Continued)

FOREIGN PATENT DOCUMENTS

| | | | | |
|---|---|---|---|---|
| JP | 2003248037 A | * | 9/2003 | ............. G01R 31/28 |
| KR | 1020100082240 | | 7/2010 | |

OTHER PUBLICATIONS

Kotaki, Koichi, Description JP2003248037, English Machine Translation retrieved from Espacenet.com.*

*Primary Examiner* — Thao H Bui
*Assistant Examiner* — Alfredo Bermudez Lozada
(74) *Attorney, Agent, or Firm* — IP & T Group LLP (57) ABSTRACT

A phase-locked loop includes a phase detection unit configured to compare the phase of a feedback clock with the phase of an input clock, a clock generation unit configured to adjust the frequency of a first clock based on a result of the comparison of the phase detection unit, a first division unit configured to generate an output clock by dividing the first clock at a first division ratio in test mode and generate the output clock by dividing the first clock at a second division ratio that is lower than the first division ratio in normal mode, and a second division unit configured to generate the feedback clock by dividing the output clock.

13 Claims, 4 Drawing Sheets

(56) References Cited

U.S. PATENT DOCUMENTS

| | | | |
|---|---|---|---|
| 7,082,179 B2* | 7/2006 | Jung | H03K 23/58 327/115 |
| 7,516,384 B2* | 4/2009 | Jeong | G11C 29/12015 324/762.01 |
| 7,619,451 B1* | 11/2009 | Hoang et al. | 327/156 |
| 7,821,855 B2* | 10/2010 | Hur | 365/201 |
| 2007/0040592 A1* | 2/2007 | Ooki | 327/116 |
| 2008/0238504 A1* | 10/2008 | Kwon | H03L 7/18 327/156 |
| 2011/0109355 A1* | 5/2011 | Sakaguchi et al. | 327/157 |

* cited by examiner

PHASE-LOCKED LOOP AND INTEGRATED CIRCUIT CHIP INCLUDING THE SAME, AND TEST SYSTEM INCLUDING THE INTEGRATED CIRCUIT CHIP

CROSS-REFERENCE TO RELATED APPLICATIONS

The present application claims priority of Korean Patent Application No. 10-2012-0046468, filed on May 2, 2012, which is incorporated herein by reference in its entirety.

BACKGROUND

1. Field

Exemplary embodiments of the present invention relate to a semiconductor design technology, and more particularly, to testing technologies for a clock synchronization system that operates in response to an external clock.

2. Description of the Related Art

With the development of the design technology of an integrated circuit (IC) and infrastructure, the time needed to process and design the integrated circuit is gradually reduced. However, the time needed to test the integrated circuit is increased because the complexity of functions embodied by the integrated circuit is gradually increased. The time needed to design the integrated circuit is necessary only at the early stage of development, whereas the time needed to test the integrated circuit continues to be necessary in a production process. An increase of the testing time is directly related to an increase in the costs of production.

Meanwhile, the development speed of test equipment does not keep up with that of an IC chip. For example, an IC chip operates at 200 MHz, whereas the test equipment supports an operation up to 40 MHz. Furthermore, although there is test equipment having the same operation speed as an IC chip, there is a heavy burden of cost to replace the test equipment periodically corresponding to the speed of an IC chip because the test equipment is very expensive. In most cases, an IC chip operates at a lower speed in a test operation than in a normal operation due to the limitation present in the test equipment.

Figure 1:
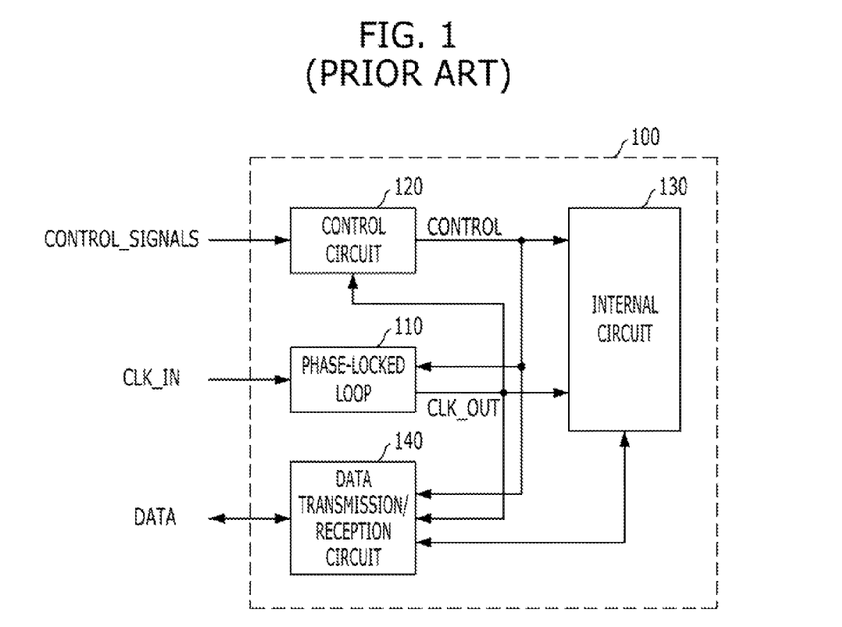
FIG. 1 is a construction diagram illustrating an IC chip including a conventional phase-locked loop.

FIG. 1 is a construction diagram illustrating an IC chip including a conventional phase-locked loop.

Referring to FIG. 1, the IC chip 100 includes a phase-locked loop 110, a control circuit 120, an internal circuit 130 and a data transmission/reception circuit 140.

The phase-locked loop 110 generates an output clock CLK_OUT in response to an input clock CLK_IN received from the outside of the IC chip 100. The output clock CLK_OUT generated from the phase-locked loop 110 becomes an internal clock used by the IC chip 100. The input clock CLK_IN and the output clock CLK_OUT may have the same frequency or different frequencies.

The control circuit 120 performs control operations on the elements of the IC chip 100 in response to control signals CONTROL_SIGNALS received outside the IC chip 100. If the IC chip 100 is memory device, the control signals CONTROL_SIGNALS may correspond to a command and an address, and the control circuit 120 may become circuits for performing control operations corresponding to a command and an address, such as a command decoder and an address decoder. The control circuit 120 is synchronized with the output clock CLK_OUT of the phase-locked loop 110.

The internal circuit 130 performs functions unique to the IC chip 100. If the IC chip 100 is memory device, the internal circuit 130 may become a memory bank for storing or reading data in response to an instruction from the control circuit 120. Furthermore, if the IC chip 100 is a central processing unit (CPU), the internal circuit 130 may become an operation circuit for performing a variety of arithmetic operations in response to an instruction from the control circuit 120. The internal circuit 130 may also be synchronized with the output clock CLK_OUT generated from the phase-locked loop 110.

The data transmission/reception circuit 140 receives data from the outside of the IC chip 100 in synchronism with the output clock CLK_OUT generated from the phase-locked loop 110, transfers the received data to the internal circuit 130, and outputs data from the internal circuit 130 to the outside of the IC chip 100.

Figure 2:
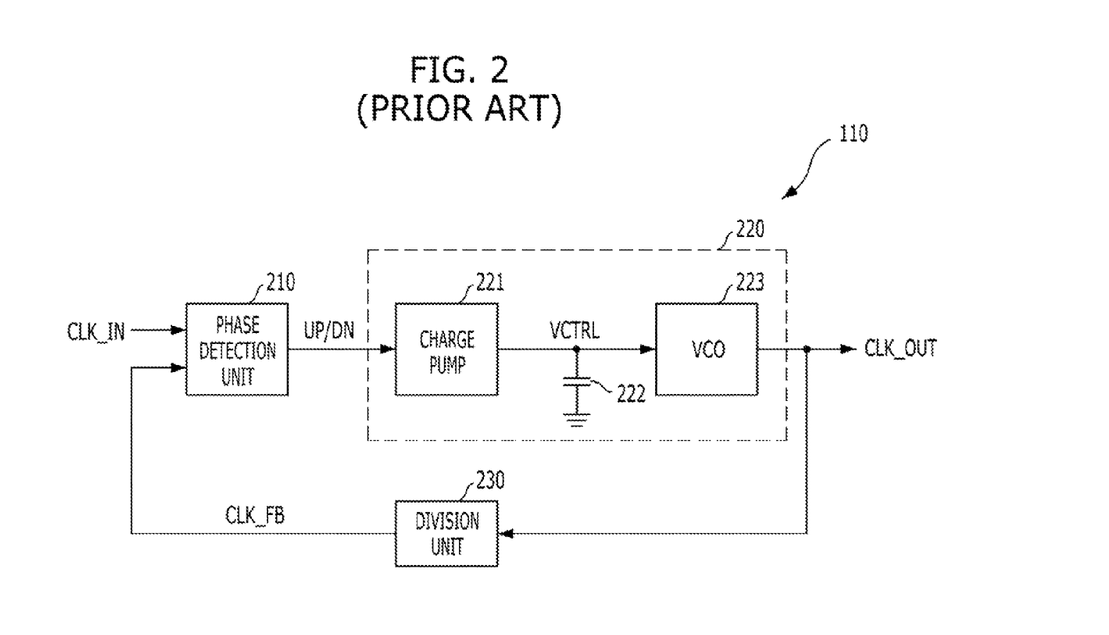
FIG. 2 is a block diagram illustrating the phase-locked loop shown in FIG. 1.

FIG. 2 is a block diagram illustrating the phase-locked loop 110 shown in FIG. 1.

Referring to FIG. 2, the phase-locked loop 110 includes a phase detection unit 210, a clock generation unit 220, and a division unit 230.

The phase detection unit 210 compares the phase of a feedback clock CLK_FB with the phase of the input clock CLK_IN and generates an up/down signal UP/DN, indicating that which one of the phases of the two clocks CLK_FB and CLK_IN runs ahead, based on a result of the comparison.

The clock generation unit 220 raises or lowers the frequency of the output clock CLK_OUT in response to the up/down signal UP/DN. The clock generation unit 220 includes a charge pump 221 configured to generate a charging/discharging current in response to the up/down signal UP/DN, a loop filter (or a low pass filter) 222 charged/discharged by the charging/discharging current to generate a control voltage VCTRL, and a voltage-controlled oscillator (VCO) 223 configured to generate the output clock CLK_OUT corresponding to the control voltage VCTRL.

The division unit 230 generates the feedback clock CLK_FB by dividing the output clock CLK_OUT. The division ratio N of the division unit 230 is defined by an equation 1 below.

$$f(CLK\_FB) \times N = f(CLK\_OUT) \qquad \text{Equation 1.}$$

Where f(CLK_FB) is the frequency of the feedback clock CLK_FB, and f(CLK_OUT) is the frequency of the output clock CLK_OUT. That is, the frequency of the output clock CLK_OUT of the phase-locked loop 110 is N times of the frequency of the input clock CLK_IN.

The input clock CLK_IN of a low frequency is applied to the IC chip 100 when a test operation is performed due to the limit of test equipment as described above. For example, if the input clock CLK_IN of 500 MHz is applied to the IC chip 100 when a normal operation is performed, the input clock CLK_IN of 20 MHz may be applied to the IC chip 100 when a test operation is performed. In this state, if the division ratio of the division unit 230 is '1', the clock generation unit 220 has to generate the output clock CLK_OUT of 500 MHz when a normal operation is performed and has to generate the output clock CLK_OUT of 20 MHz when a test operation is performed. In order to support the normal operation and the test operation, the clock generation unit 220 has to have an operating range (or a locking range) of about 20~500 MHz.

As described above, it is very difficult to design the clock generation unit 220 so that the clock generation unit 220 supports an operating range having a difference of tens to several hundreds owing to a difference between the operating speeds of a normal operation and a test operation.

Furthermore, there is a concern in that an area of the clock generation unit 220 is greatly increased although the clock generation unit 220 may be designed.

SUMMARY

Exemplary embodiments of the present invention are directed to providing a phase-locked loop which normally operates even when an operating frequency is different in a normal operation and a test operation, an IC chip including the phase-locked loop, and a test system including the IC chip.

In accordance with an embodiment of the present invention, a phase-locked loop includes a phase detection unit configured to compare the phase of a feedback clock with the phase of an input clock, a clock generation unit configured to adjust the frequency of a first clock based on a result of the comparison of the phase detection unit, a first division unit configured to generate an output clock by dividing the first clock at a first division ratio in test mode and generate the output clock by dividing the first clock at a second division ratio that is lower than the first division ratio in normal mode, and a second division unit configured to generate the feedback clock by dividing the output clock.

In accordance with another embodiment of the present invention, a phase-locked loop includes a phase detection unit configured to compare the phase of an output clock with the phase of an input clock, a clock generation unit configured to adjust the frequency of a first clock based on a result of the comparison of the phase detection unit, and a division unit configured to generate the output clock by dividing the first clock at a first division ratio in test mode and generate the output clock by dividing the first clock at a second division ratio that is lower than the first division ratio in normal mode.

In accordance with another embodiment of the present invention, an IC chip includes a phase detection unit configured to compare the phase of a feedback clock with the phase of an input clock, a clock generation unit configured to adjust the frequency of a first clock based on a result of the comparison of the phase detection unit, a first division unit configured to generate an output clock by dividing the first clock at a first division ratio in test mode and generate the output clock by dividing the first clock at a second division ratio that is lower than the first division ratio in normal mode, a second division unit configured to generate the feedback clock by dividing the output clock, and a data transmission/reception circuit configured to transmit/receive data in synchronism with the output clock.

In accordance with another embodiment of the present invention, an IC chip includes a phase detection unit configured to compare the phase of an output clock with the phase of an input clock, a clock generation unit configured to adjust the frequency of a first clock based on a result of the comparison of the phase detection unit, a division unit configured to generate the output clock by dividing the first clock at a first division ratio in test mode and generate the output clock by dividing the first clock at a second division ratio that is lower than the first division ratio in normal mode, and a data transmission/reception circuit configured to trans receive data in synchronism with the output clock.

In accordance with another embodiment of the present invention, a test system includes test equipment and an IC chip. The test equipment transfers an input clock to the IC chip and transmits/receives data to/from the IC chip. The IC chip includes a phase detection unit configured to compare the phase of a feedback clock with the phase of the input clock, a clock generation unit configured to adjust the frequency of a first clock based on a result of the comparison of the phase detection unit, a first division unit configured to generate an output clock by dividing the first clock at a first division ratio in test mode in which the IC chip operates along with the test equipment and generate the output clock by dividing the first clock at a second division ratio that is lower than the first division ratio in normal mode, a second division unit configured to generate the feedback clock by dividing the output clock, and a data transmission/reception circuit configured to transmit/receive data to/from the test equipment in synchronism with the output clock.

In accordance with another embodiment of the present invention, a test system includes test equipment and an IC chip. The test equipment transfers an input clock to the IC chip and transmits/receives data to/from the IC chip. The IC chip includes a phase detection unit configured to compare the phase of an output clock with the phase of the input clock, a clock generation unit configured to adjust the frequency of a first clock based on a result of the comparison of the phase detection unit a division unit configured to generate the output clock by dividing the first clock at a first division ratio in test mode in which the IC chip operates along with the test equipment and generate the output clock by dividing the first clock at a second division ratio that is lower than the first division ratio in normal mode, and a data transmission/reception circuit configured to transmit/receive data to/from the test equipment in synchronism with the output clock.

In accordance with another embodiment of the present invention, a memory test system using a control clock and a data clock includes test equipment configured to apply the control clock and the data clock having an identical frequency to a memory chip, and the memory chip configured to include a control circuit for performing control operations in synchronism with a control clock received from the test equipment, a phase-locked loop for generating an internal data clock of a higher frequency using the data clock received from the test equipment, and a data transmission/reception circuit for exchanging data with the test equipment in synchronism with the internal data clock, wherein the control clock and the data clock having different frequencies are applied to the memory chip in a normal operation in which the memory chip operates along with a memory controller not the test equipment, and the phase-locked loop generates the internal data clock having a frequency identical with a frequency of the data clock.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
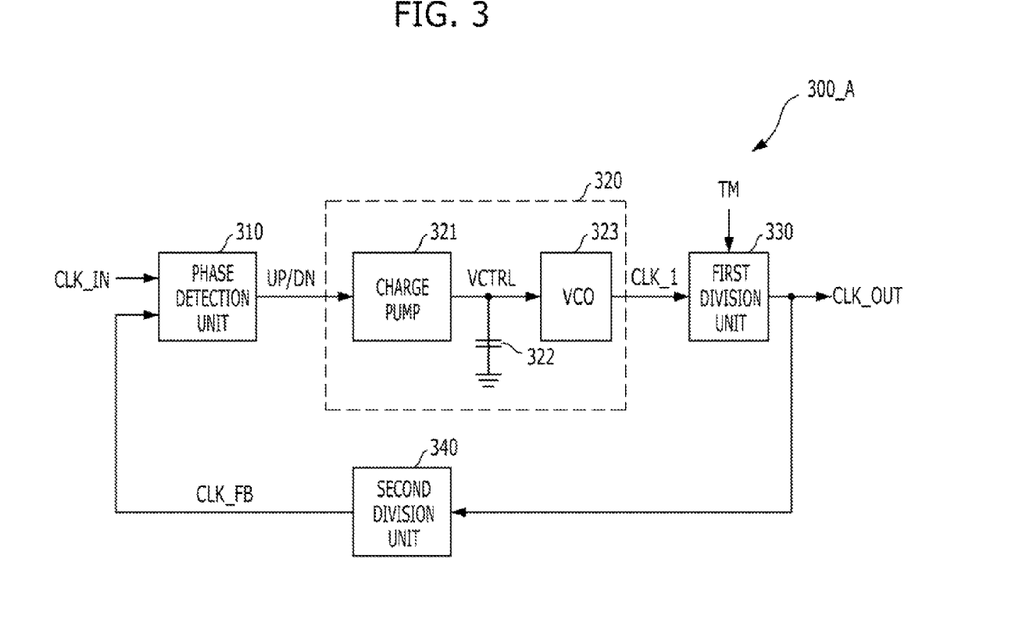
FIG. 3 is a block diagram illustrating a phase-locked loop in accordance with an embodiment of the present invention.

FIG. 3 is a block diagram illustrating a phase-locked loop in accordance with an embodiment of the present invention.

Referring to FIG. 3, the phase-locked loop 300_A includes a phase detection unit 310, a clock generation unit 320, a first division unit 330, and a second division unit 340.

The phase detection unit 310 compares the phase of a feedback clock CLK_FB with the phase of the input clock CLK_IN and generates an up/down signal UP/DN, indicating that which one of the phases of the two clocks CLK_FB and CLK_IN runs faster, based on a result of the comparison.

The clock generation unit 320 raises or lowers the frequency of a first clock CLK_1 in response to the up/down signal UP/DN. The clock generation unit 320 may include a charge pump 321 configured to generate a charging/discharging current in response to the up/down signal UP/DN, a loop filter 322 charged/discharged by the charging/discharging current to generate a control voltage VCTRL, and a VCO 323 configured to generate the first clock CLK_1 corresponding to the control voltage VCTRL. Here, although the clock generation unit 320 has been illustrated as being designed in an analog type, the clock generation unit 320 may be designed in a digital type. If the clock generation unit 320 is designed in a digital type, the clock generation unit 320 may include a control circuit for generating a digital code in response to the up/down signal UP/DN and a digitally controlled oscillator (DCO) for generating the first clock CLK_1 corresponding to the digital code.

The first division unit 330 generates an output clock CLK_OUT by dividing the first clock CLK_1 at a high division ratio in test mode and generates the output clock CLK_OUT by dividing the first clock CLK_1 at a low division ratio in a normal mode. Here, the low division ratio includes a case where the first clock CLK_1 is transferred as the output clock CLK_OUT without change, that is, the division ratio is '1'. For example, the first division unit 330 may generate the output clock CLK_OUT by dividing the first clock CLK_1 at a division ratio 10 in test mode and transfer the first clock CLK_1 as the output clock CLK_OUT without change in the normal mode. A test mode signal TM inputted to the first division unit 330 is activated when a test operation is performed and is deactivated when a normal operation is performed.

The second division unit 340 generates the feedback clock CLK_FB by dividing the output clock CLK_OUT.

In the phase-locked loop 300_A of FIG. 3, the frequency of the output clock CLK_OUT is (the division ratio of the second division unit 340)×(the frequency of the input clock CLK_IN). In contrast, the frequency of the first clock CLK_1 generated from the clock generation unit 320 is (the division ratio of the second division unit 340)×(the division ratio of the first division unit 330)×(the frequency of the input clock CLK_IN). It is assumed that in a normal operation, the frequency of the input clock CLK_IN is about 250 MHz, the division ratio of the first division unit 330 is '1', and the division ratio of the second division unit 340 is '2' and in a test operation, the frequency of the input clock CLK_IN is about 25 MHz, the division ratio of the first division unit 330 is '10', and the division ratio of the second division unit 340 is '2'. In this case, when a normal operation is performed, the frequency of the first clock CLK_1 generated from the clock generation unit 320 is about 500 MHz and the frequency of the output clock CLK_OUT is about 500 MHz. Furthermore, when a test operation is performed, the frequency of the first clock CLK_1 generated from the clock generation unit 320 is about 500 MHz and the frequency of the output clock CLK_OUT is about 50 MHz. In the phase-locked loop 300_A of FIG. 3, when a test operation is performed, the output clock CLK_OUT of the low frequency of about 50 MHz is generated in response to the lowered frequency of about 25 MHz of the input clock CLK_IN, but the frequency of the first clock CLK_1 generated from the clock generation unit 320 may maintain the frequency of about 500 MHz, substantially similar to the frequency in normal operation.

As a result, if the phase-locked loop 300_A is designed as in FIG. 3, the clock generation unit 320 may be designed to have a narrow operating range although the input clock CLK_IN of a high frequency is received when a normal operation is performed and the input clock CLK_IN of a low frequency is received when a test operation is performed.

Figure 4:
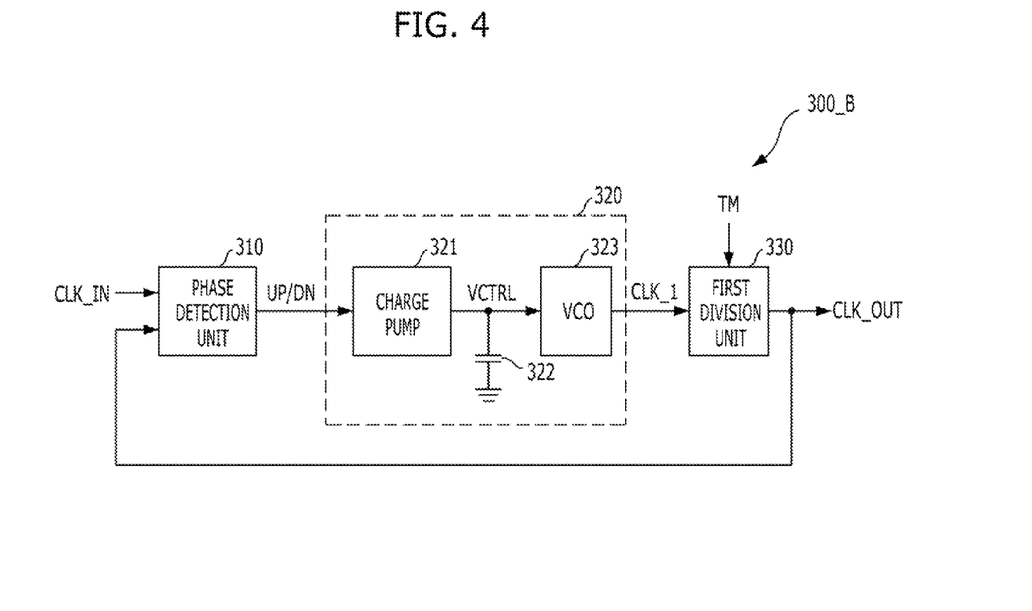
FIG. 4 is a block diagram illustrating a phase-locked loop in accordance with another embodiment of the present invention.

FIG. 4 is a block diagram illustrating a phase-locked loop in accordance with another embodiment of the present invention.

Referring to FIG. 4, the phase-locked loop 300_B includes a phase detection unit 310, a clock generation unit 320, and a division unit 330. The phase-locked loop 300_B has a construction in which the division unit 340, that is, a feedback division unit, is omitted from the phase-locked loop 300_A of FIG. 3. Accordingly, the output clock CLK_OUT is used as the feedback clock CLK_FB inputted to the phase detection unit 310.

As described above, the division unit 340 of the feedback loop is omitted from the phase-locked loop 300_B. However, even when the input clock CLK_IN of a high frequency is received when a normal operation is performed, and the input clock CLK_IN of a low frequency is received when a test operation is performed, the phase-locked loop 300_B operates like the phase-locked loop 300_A in that the clock generation unit 320 generates the first clock CLK_1 of a high frequency in both cases.

Figure 5:
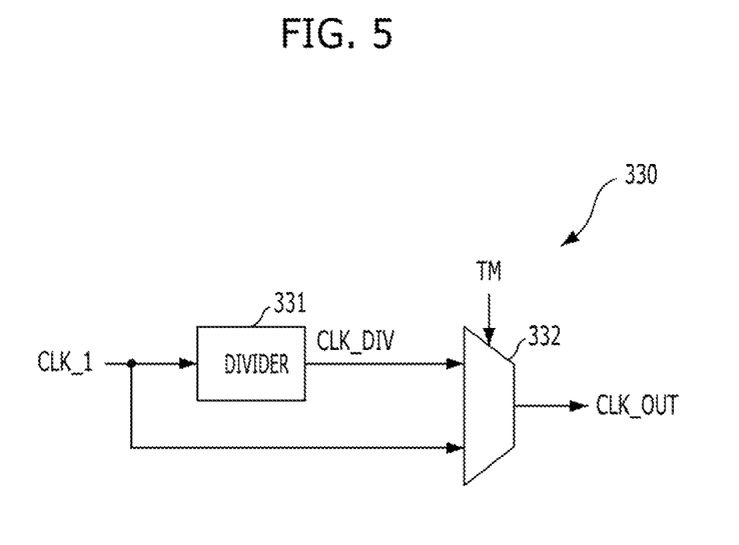
FIG. 5 is a detailed diagram illustrating an embodiment of the division unit shown in FIGS. 3 and 4.

FIG. 5 is a detailed diagram illustrating an embodiment of the division unit 330 shown in FIGS. 3 and 4.

Referring to FIG. 5, the division unit 330 may include a divider 331 and a selector 332.

The divider 331 generates a division clock CLK_DIV by dividing the first clock CLK_1 at a given division ratio (for example, a division ratio '10').

The selector 332 selects the division clock CLK_DIV when the test mode signal TM is activated, that is, in test mode, and transfers the division clock CLK_DIV as the output clock CLK_OUT. Furthermore, the selector 332 selects the first clock CLK_1 when the test signal TM is deactivated, that is, in normal mode, and transfers the first clock CLK_1 as the output clock CLK_OUT.

Accordingly, in normal mode, the division unit 330 transfers the first clock. CLK_1 as the output clock CLK_OUT without change. In test mode, the division unit 330 divides the first clock CLK_1 at the division ratio '10' and transfers the divided clock as the output clock CLK_OUT.

Unlike in FIG. 5, the division unit 330 may include only one divider without the selector 332. In this case, the divider has only to be designed so that a division ratio thereof is varied in response to a level of the test mode signal TM. For example, the divider may be designed so that the division ratio is set to '10' when the test mode signal TM is activated and may be designed so that the division ratio is set to '1' when the test mode signal TM is deactivated.

Figure 6:
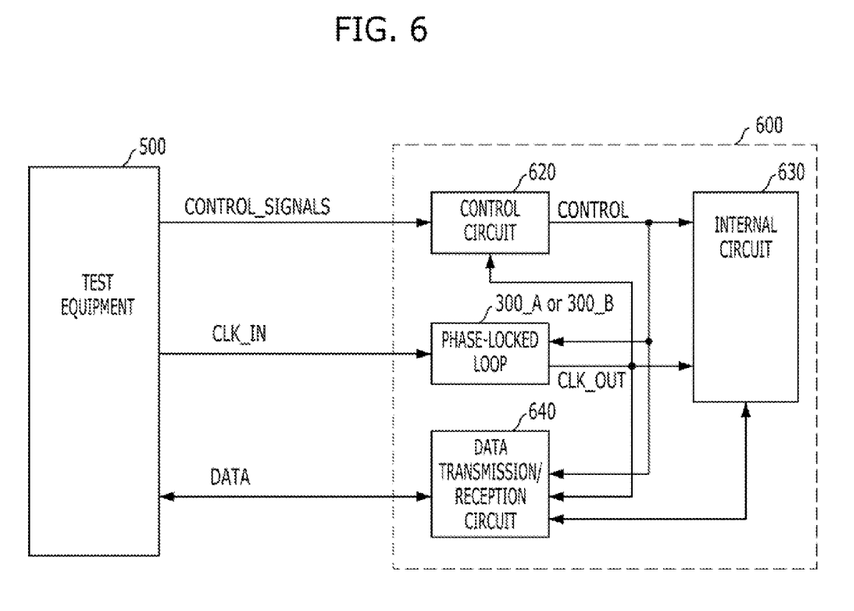
FIG. 6 is a construction diagram illustrating a test system including the phase-locked loop in accordance with the embodiments of the present invention.

FIG. 6 is a construction diagram illustrating a test system including the phase-locked loop 300_A or 300_B in accordance with the embodiments of the present invention.

Referring to FIG. 6, the test system includes test equipment 500 and an IC chip 600.

The test equipment 500 tests the IC chip 600. The IC chip 600 is subject to the Device Under Test (DUT) of the test equipment 500. The test equipment 500 sends control signals CONTROL_SIGNALS and an input clock CLK_IN to the IC chip 600, transmits and receives data DATA to and from the IC chip 600, and checks whether the IC chip 600 operates normally. Although one IC chip 600 is illustrated as being connected to the test equipment 500, tens to several hundreds of the IC chips 600 may be connected to the test equipment 500 and may be tested at the same time in a real test. As described above, in most cases, the test equipment 500 operates at a slower speed than the IC chip 600 due to the limit of equipment and costs. For example, the IC chip 600 may operate in response to the input clock CLK_IN of 250 MHz when a normal operation is performed, but may receive the input clock CLK_IN of 25 MHz in a test operation in which the IC chip 600 operates along with the test equipment 500.

The IC chip 600 includes the phase-locked loop 300_A or 300_B, a control circuit 620, an internal circuit 630, and a data transmission/reception circuit 640.

The phase-locked loop 300_A or 300_B generates an output clock CLK_OUT in response to the input clock CLK_IN received from the test equipment 500. The output clock CLK_OUT generated from the phase-locked loop 300_A or 300_B becomes an internal clock used by the IC chip 600. The input clock CLK_IN and the output clock CLK_OUT may have the same frequency (for example, when the division ratio of the division unit is '1') or may have different frequencies (for example, when the division ratio of the division unit is not '1'). In this case, although the test equipment 500 supplies the phase-locked loop 300_A or 300_B with the input clock CLK_IN having a frequency that is lower than the frequency in a normal operation, the clock generation unit 320 of the phase-locked loop 300_A or 300_B generates the first clock CLK_1 having the same high frequency as that in the normal operation as described above.

The control circuit 620 performs control operations on the elements of the IC chip 600 in response to the control signals CONTROL_SIGNALS generated from the test equipment 500. A test mode signal TM supplied to the phase-locked loop 300_A or 300_B may be generated from the control circuit 620. If the IC chip 600 is memory, the control signals CONTROL_SIGNALS correspond to a command and an address, and the control circuit 620 becomes circuits for performing the control operations corresponding to the command and the address, such as a command decoder and an address decoder. The control circuit 620 is synchronized with the output clock CLK_OUT generated from the phase-locked loop 300_A or 300_B.

The internal circuit 630 performs functions that are appropriate for the IC chip 600. If the IC chip is memory, the internal circuit 630 may become a memory bank for storing or reading data in response to an instruction generated from the control circuit 620. Furthermore, if the IC chip 600 is a CPU, the internal circuit 630 may become an operation circuit for performing a variety of arithmetic operations in response to an instruction generated from the control circuit 620. The internal circuit 630 may also be synchronized with the output clock CLK_OUT generated from the phase-locked loop 300_A or 300_B.

The data transmission/reception circuit 640 receives data from the test equipment 500 in synchronism with the output clock CLK_OUT generated from the phase-locked loop 300_A or 300_B, transfers the received data to the internal circuit 630, and sends data from the internal circuit 630 to the test equipment 500.

When a test operation is performed the IC chip 600 operates along with the test equipment 500 which operates slowly. Even in this case, the clock generation unit 320 of the phase-locked loop 300_A or 300_B generates the first clock CLK_1 having the same frequency as that when a normal operation is performed (that is, when the IC chip 600 operates along with other chips on an application substrate not the test equipment 500). Accordingly, even when a test operation is performed, a normal operation of the phase-locked loop 300_A or 300_B may be guaranteed.

Figure 7:
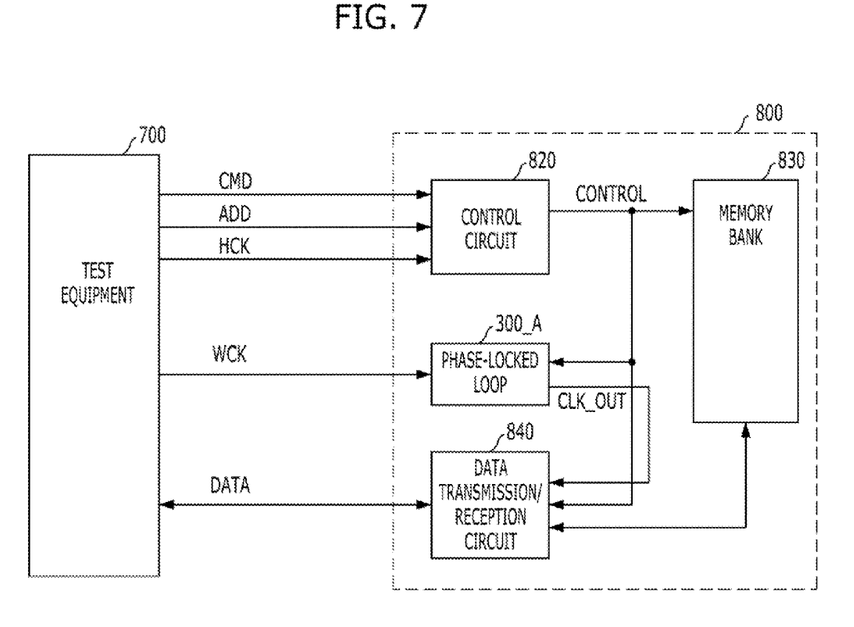
FIG. 7 is a construction diagram illustrating a memory test system including the phase-locked loop in accordance with the embodiments of the present invention.

FIG. 7 is a construction diagram illustrating a memory test system including the phase-locked loop 300_A in accordance with the embodiments of the present invention.

Referring to FIG. 7, the memory test system includes test equipment 700 and a memory chip 800.

In the following description, two types of a control clock HCK and a data clock WCK are described. The control clock HCK and the data clock WCK are first described below. The control clock HCK is configured to control the command CMD and the address ADD of the memory chip 800 and other related matters, and the data clock WCK is configured to synchronize data DATA that is transmitted to and received from the memory chip 800. The memory chip 800 receives the address ADD and the command CMD of a low frequency, but receives the data DATA of a high frequency. This is because the data clock WCK has a frequency twice greater than that of the control clock HCK. For example, in a normal operation, if the data clock WCK has a frequency of 400 MHz, the control clock HCK has a frequency of 200 MHz.

The test equipment 700 tests the memory chip 800. The memory chip 800 is subject to the DUT of the test equipment 700. The test equipment 700 sends the command CMD, the address ADD, the control clock HCK, and the data clock WCK to the memory chip 800, transmits and receives the data DATA to and from the memory chip 800, and checks whether the memory chip 800 operates normally. The test equipment 700 generates the control clock HCK and the data clock WCK at its limit frequency, that is, a maximum frequency that may be generated by the test equipment 700, and transfers the control clock HCK and the data clock WCK having the maximum frequency to the memory chip 800. If a maximum frequency of a clock that may be generated by the test equipment 700 is 40 MHz, the test equipment 700 generates the control clock HCK and the data clock WCK each having the maximum frequency of 40 MHz and transfers them to the memory chip 800. This point is different from a point in which the control clock HCK and the data clock WCK having different frequencies are supplied to the memory chip 800 when a normal operation is performed.

The memory chip 800 includes the phase-locked loop 300_A, a control circuit 820, a memory bank 830, and a data transmission/reception circuit 840.

The phase-locked loop 300_A generates an output clock CLK_OUT in response to the data clock WCK supplied from the test equipment 700. Since the test equipment 700 has supplied the data clock WCK having the same frequency as the control clock HCK, control needs to be performed so that the frequency of the output clock CLK_OUT internally used within memory becomes twice greater than the frequency of the control clock HCK. Accordingly, the phase-locked loop 300_A generates the output clock CLK_OUT having a frequency twice greater than that of the received data clock WCK. This operation is made possible by setting the division ratio of the second division unit 340 on the feedback loop of the phase-locked loop 300_A to '2' in test mode in which the memory chip 800 operates along with the test equipment 700.

The control circuit 820 performs control operations in response to the command CMD and the address ADD of the test equipment 700 so that the memory bank 830, the data transmission/reception circuit 840, and the phase-locked loop 300_A of the memory chip 800 perform operations, such as read and write operations. The control operations of the control circuit 820 are synchronized with the control clock HCK.

When a write operation is performed, the data transmission/reception circuit 840 receives data from the test equipment 700 in synchronism with the output clock CLK_OUT of the phase-locked loop 300_A and transfers the received data to the memory bank 830. When a read operation is performed, the data transmission/reception circuit 840 sends data from the memory bank 830 to the test equipment 700 in synchronism with the output clock CLK_OUT.

The memory bank 830 stores data received form the data transmission/reception circuit 840 or transfers data stored therein to the data transmission/reception circuit 840 under the control of the control circuit 820.

The internal output clock CLK_OUT having a frequency twice greater than that of the data clock WCK may be generated from the phase-locked loop 300_A within the memory chip 800. Accordingly, the memory chip 800 may be tested using a clock having a frequency higher than a maximum frequency that may be generated from the test equipment 700. Furthermore, since the phase-locked loop 300_A internally generates the first clock CLK_1 having the same frequency both a normal operation and a test operation, a normal operation of the phase-locked loop 300_A may be guaranteed when a test is performed.

In accordance with the present invention, when a test operation is performed, the output clock outputted from the phase-locked loop maintains a low frequency, whereas a clock internally generated within the phase-locked loop may maintain a high frequency. Accordingly, the phase-locked loop may easily support operating frequencies both in a normal operation and a test operation.

While the present invention has been described with respect to the specific embodiments, it will be apparent to those skilled in the art that various changes and modifications may be made without departing from the spirit and scope of the invention as defined in the following claims.

What is claimed is:

1. A phase-locked loop circuit, comprising:
   a phase detection unit configured to compare a phase of a feedback clock with a phase of an input clock;
   a clock generation unit configured to generate a first clock by adjusting a frequency of the feedback clock or the input clock based on a result of the comparison of the phase detection unit;
   a first division unit configured to receive the first clock from the clock generation unit, generate an output clock of the phase-locked loop circuit by dividing the first clock at a first division ratio in test mode or by dividing the first clock at a second division ratio that is lower than the first division ratio in normal mode, and output the output clock of the phase-locked loop circuit; and
   a second division unit configured to receive the output clock of the phase-locked loop circuit from the first division unit, and generate the feedback clock by dividing the output clock at a third division ratio,
   wherein the output clock of the phase-locked loop circuit is a multiplication of the frequency of the input clock and the third division ratio of the second division unit.

2. The phase-locked loop circuit of claim 1, wherein the clock generation unit comprises:
   a charge pump configured to generate a charging/discharging current based on a result of the comparison of the phase detection unit;
   a loop filter charged/discharged in response to the charging/discharging current to generate a control voltage; and
   a voltage-controlled oscillator (VCO) configured to generate the first clock having a frequency controlled in response to the control voltage.

3. The phase-locked loop circuit of claim 1, wherein the first division unit comprises a divider having the first or second division ratio in response to a test mode signal indicative of the test mode.

4. The phase-locked loop circuit of claim 1, wherein the first division unit comprises:
   a divider configured to generate a division clock by dividing the first clock at the first division ratio; and
   a selector configured to transfer the division clock or the first clock as the output clock in response to a test mode signal indicative of the test mode.

5. The phase-locked loop circuit of claim 1, wherein the second division unit divides the output clock at a fixed division ratio.

6. The phase-locked loop circuit of claim 1, wherein the frequency of the first clock is a multiplication of the frequency of the input clock, the third division ratio of the second division unit and the first division ratio or the second division ratio of the first division unit.

7. An integrated circuit (IC) chip, comprising:
   a phase detection unit configured to compare a phase of a feedback clock with a phase of an input clock;
   a clock generation unit configured to generate a first clock by adjusting a frequency of the feedback clock or the input clock based on a result of the comparison of the phase detection unit;
   a first division unit configured to receive the first clock from the clock generation unit, generate an output clock of the IC chip by dividing the first clock at a first division ratio in test mode or by dividing the first clock at a second division ratio that is lower than the first division ratio in normal mode, and output the output clock of the IC chip;

a second division unit configured to receive the output clock of the IC chip and generate the feedback clock by dividing the output clock at a third division ratio; and a data transmission/reception circuit configured to transmit/receive data in synchronism with the output clock, wherein the output clock of the phase-locked loop circuit is a multiplication of the frequency of the input clock and the third division ratio of the second division unit.

8. The IC chip of claim 7, wherein the clock generation unit comprises:

a charge pump configured to generate a charging/discharging current based on a result of the comparison of the phase detection unit;

a loop filter charged/discharged in response to the charging/discharging current to generate a control voltage; and a voltage-controlled oscillator (VCO) configured to generate the first clock having a frequency controlled in response to the control voltage.

9. The IC chip of claim 7, wherein the first division unit comprises a divider having the first or second division ratio in response to a test mode signal indicative of the test mode.

10. The IC chip of claim 7, wherein the first division unit comprises:

a divider configured to generate a division clock by dividing the first clock at the first division ratio; and a selector configured to transfer the division clock or the first clock as the output clock in response to a test mode signal indicative of the test mode.

11. The IC chip of claim 7, wherein the second division unit divides the output clock at a fixed division ratio.

12. A test system, comprising test equipment and an integrated circuit (IC) chip, wherein:

the test equipment transfers an input clock to the IC chip and transmits/receives data to/from the IC chip, and the IC chip comprises:

a phase detection unit configured to compare a phase of a feedback clock with a phase of the input clock;

a clock generation unit configured to generate a first clock by adjusting a frequency of the feedback clock or the input clock based on a result of the comparison of the phase detection unit;

a first division unit configured to receive the first clock from the clock generation unit, generate an output clock of the IC chip by dividing the first clock at a first division ratio in test mode in which the IC chip operates along with the test equipment or by dividing the first clock at a second division ratio that is lower than the first division ratio in normal mode, and output the output clock of the IC chip;

a second division unit configured to receive the output clock of the IC chip and generate the feedback clock by dividing the output clock at a third division ratio; and a data transmission/reception circuit configured to transmit/receive data to/from the test equipment in synchronism with the output clock, wherein the output clock of the phase-locked loop circuit is a multiplication of the frequency of the input clock and the third division ratio of the second division unit.

13. A memory test system using a control clock and a data clock, comprising:

test equipment configured to apply the control clock and the data clock having an identical frequency to a memory chip; and the memory chip configured to comprise a control circuit for performing control operations in synchronism with a control clock received from the test equipment, a phase-locked loop circuit for generating an internal data clock of a higher frequency using the data clock received from the test equipment, and a data transmission/reception circuit for exchanging data with the test equipment in synchronism with the internal data clock, wherein the control clock and the data clock having different frequencies are applied to the memory chip in a normal operation in which the memory chip operates along with a memory controller not the test equipment, and the phase-locked loop circuit generates the internal data clock having a frequency identical with a frequency of the data clock, and includes:

a phase detection unit configured to compare a phase of a feedback clock with a phase of an input clock;

a clock generation unit configured to generate a first clock by adjusting a frequency of the feedback clock or the input clock based on a result of the comparison of the phase detection unit;

a first division unit configured to receive the first clock from the clock generation unit, generate an output clock of the phase-locked loop circuit by dividing the first clock at a first division ratio in test mode or by dividing the first clock at a second division ratio that is lower than the first division ratio in normal mode and output the output clock of the phase-locked loop circuit; and a second division unit configured to generate the feedback clock by dividing the output clock at a third division ratio, wherein the output clock of the phase-locked loop circuit is a multiplication of the frequency of the input clock and the third division ratio of the second division unit.

\* \* \* \* \*